US012808962B2

(12) United States Patent
Maruyama et al.

(10) Patent No.: US 12,808,962 B2
(45) Date of Patent: Nov. 24, 2026

(54) MRI APPARATUS AND MRI METHOD

(71) Applicant: CANON KABUSHIKI KAISHA, Tokyo (JP)

(72) Inventors: Shuki Maruyama, Nasushiobara (JP); Hidenori Takeshima, Taito (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 108 days.

(21) Appl. No.: 18/800,219

(22) Filed: Aug. 12, 2024

(65) Prior Publication Data

US 2025/0060438 A1 Feb. 20, 2025

(30) Foreign Application Priority Data

Aug. 17, 2023 (JP) ................................ 2023-133145

(51) Int. Cl.

*G01R 33/38* (2006.01)
*G01R 33/3875* (2006.01)
*G01R 33/485* (2006.01)
*G01R 33/54* (2006.01)

(52) U.S. Cl.

CPC ....... *G01R 33/3875* (2013.01); *G01R 33/485* (2013.01); *G01R 33/543* (2013.01)

(58) Field of Classification Search

CPC G01R 33/3875; G01R 33/485; G01R 33/543; G01R 33/5607; G01R 33/56563

See application file for complete search history.

(56) References Cited

U.S. PATENT DOCUMENTS

| | | | | |
|---|---|---|---|---|
| 2006/0197526 A1* | 9/2006 | Weiger | G01R 33/3875 | 324/309 |
| 2008/0088306 A1* | 4/2008 | Dewdney | A61B 5/055 | 324/309 |
| 2019/0346521 A1 | 11/2019 | Nitta et al. | | |
| 2020/0041593 A1 | 2/2020 | Nitta et al. | | |

FOREIGN PATENT DOCUMENTS

| | | |
|---|---|---|
| JP | 2019-195588 A | 11/2019 |
| JP | 2020-22572 A | 2/2020 |

* cited by examiner

*Primary Examiner* — G.M. A Hyder

(74) *Attorney, Agent, or Firm* — Oblon, McClelland, Maier & Neustadt, L.L.P.

(57) ABSTRACT

In one embodiment, an MRI apparatus comprising: a static magnetic field magnet configured to generate a static magnetic field; a shim coil configured to enhance uniformity of the static magnetic field; and processing circuitry configured to acquire shimming data for correcting static magnetic field non-uniformity, control an electric current value of the shim coil by using the shimming data, acquire MR image generation data by performing an imaging scan that acquires magnetic resonance signals for generating an image of the object, determine whether to reacquire the shimming data during the imaging scan or not, based on the MR image generation data, and reacquire the shimming data during the imaging scan if reacquisition is determined, and control the electric current value of the shim coil during the imaging scan based on reacquired shimming data.

20 Claims, 14 Drawing Sheets

MRI APPARATUS AND MRI METHOD

CROSS-REFERENCE TO RELATED APPLICATION

This application claims the benefit of priority of Japanese Patent Application No. 2023-133145, filed on Aug. 17, 2023, the entire contents of which are incorporated herein by reference.

FIELD

Disclosed Embodiments relate to a magnetic resonance imaging (MRI) apparatus and an MRI method.

BACKGROUND

When an object is placed in a strong magnetic field, nuclear spins of the molecules constituting the object are aligned and the nuclear spins precess at the Larmor frequency. When an RF pulse based on a radio frequency (RF) signal at the Larmor frequency is applied to the object in this state, the nuclear spins of the molecules resonate with the RF signal and are excited, and then a magnetic resonance (MR) signal is emitted from the object when the molecules return to their original stable state.

As techniques using magnetic resonance, MRI and magnetic resonance spectroscopy (MRS) are known.

MRI is a technology that generates an image of an object by using MR signals emitted from the object. In MRI, an image of the object is generated by: making the frequency and phase of the MR signals slightly different for each spatial position of the object; and thereby associating the position inside the object with the intensity of each MR signal.

MRS is a technology that uses MR signals emitted from the object to detect, analyze, or display spectra of substances in a specific region of the object. The magnetic resonance frequency is known to slightly differ depending on the metabolite contained in the object, such as choline, creatine, and NAA (N-acetylaspartic acid), due to difference in chemical bonding of the molecules. The deviation of the magnetic resonance frequency of each substance from the magnetic resonance frequency of a specific reference substance, i.e., the reference magnetic resonance frequency, is referred to as a chemical shift.

In MRI and MRS using an MRI apparatus, uniformity of a static magnetic field is required in order to satisfactorily maintain image quality of MR images. In order to enhance the uniformity of the static magnetic field under the state where an examinee is placed in the static magnetic field, a magnetic field adjustment technique called active shimming is known for controlling an electric current value of a shim coil.

DETAILED DESCRIPTION

Hereinbelow, respective embodiments of an MRI apparatus and an MRI method will be described in detail by referring to the accompanying drawings.

In one embodiment, an MRI apparatus comprising: a static magnetic field magnet configured to generate a static magnetic field; a shim coil configured to enhance uniformity of the static magnetic field; and processing circuitry configured to acquire shimming data for correcting static magnetic field non-uniformity, control an electric current value of the shim coil by using the shimming data, acquire MR image generation data by performing an imaging scan that acquires magnetic resonance signals for generating an image of the object, determine whether to reacquire the shimming data during the imaging scan or not, based on the MR image generation data, and reacquire the shimming data during the imaging scan if reacquisition is determined, and control the electric current value of the shim coil during the imaging scan based on reacquired shimming data.

(Overall Configuration of MRI Apparatus)

Figure 1:
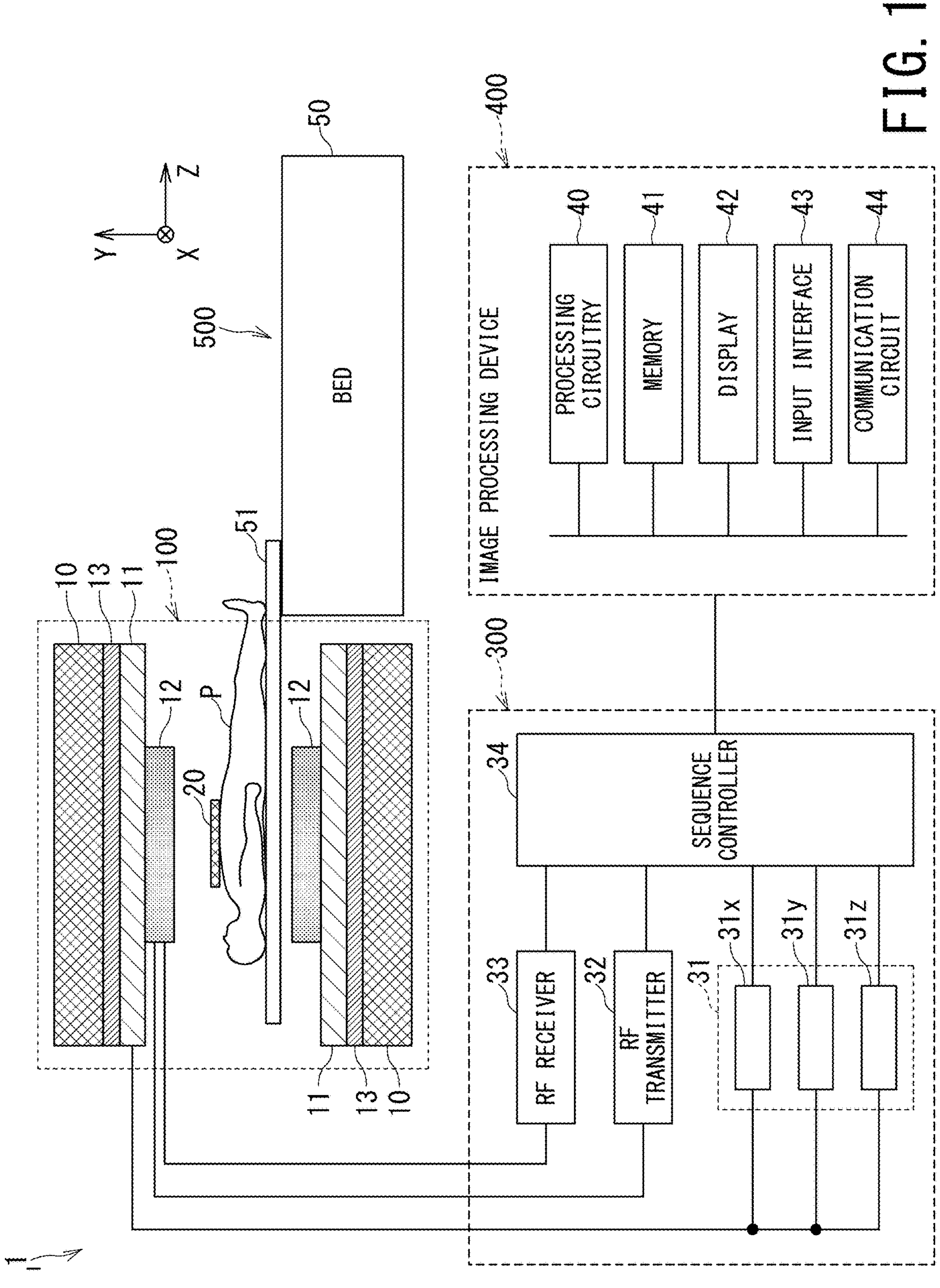
FIG. 1 is a block diagram illustrating an overall configuration of an MRI apparatus according to one embodiment.

An MRI apparatus 1 according to one embodiment can use MRI techniques. FIG. 1 is a block diagram illustrating an overall configuration of the MRI apparatus 1 according to the embodiment. The MRI apparatus 1 according to the embodiment includes a gantry 100, a control cabinet 300, an image processing device 400 such as a console, and a bed 500.

The gantry 100 and the bed 500 are disposed in a shielded room called an examination room, for example. The control cabinet 300 is disposed in a machine room and the image processing device 400 is disposed in a control room, for example. Note that the image processing device 400 may be installed in a remote location away from the control room and be connected to the MRI apparatus 1 via a network.

The gantry 100 includes a static magnetic field magnet 10, a gradient coil 11, an WB (Whole Body) coil 12, and a shim coil 13. The static magnetic field magnet 10 of the gantry 100 is broadly classified into a cylindrical type in which the magnet has a cylindrical structure and an open type in which a pair of magnets are provided above and below an imaging space such that the imaging space is interposed therebetween. Although a description will be given of a case where the gantry 100 of the MRI apparatus 1 is cylindrical, the gantry 100 of the MRI apparatus 1 may be configured as the open-type. The open-type MRI apparatus has the same configuration as the cylindrical MRI apparatus 1 except that each of the static magnetic field magnets, the gradient coil, and the WB coil constituting the gantry are formed into a pair of tabular structures in parallel with each other.

The static magnetic field magnet 10 is substantially in the form of a cylinder and generates a static magnetic field inside a bore into which an object P is moved. The bore is a space inside the cylindrical structure of the gantry 100. The static magnetic field magnet 10 is composed of a housing for holding liquid helium, a refrigerator for cooling down the liquid helium to an extremely low temperature, and a superconducting coil inside the housing, for example. Note that the static magnetic field magnet 10 may be configured as a permanent magnet. Hereinafter, a description will be given of a case where the static magnetic field magnet 10 has the superconducting coil.

The static magnetic field magnet 10 includes the superconducting coil inside, and the superconducting coil is cooled down to an extremely low temperature by the liquid helium. The static magnetic field magnet 10 generates a static magnetic field by supplying the superconducting coil with an electric current provided from a static magnetic field power supply (not shown) in an excitation mode. Afterward, when the static magnetic field magnet 10 shifts to a persistent current mode, the static magnetic field power supply is disconnected. Once it enters the persistent current mode, the static magnetic field magnet 10 continues to generate a strong static magnetic field for a long time, for example, over one year.

The gradient coil 11 is also substantially in the form of a cylinder and is fixed to the inside of the static magnetic field magnet 10. To be exact, the gradient coil 11 is a collective term for a gradient coil assembly that is composed of three gradient coils for the respective X-axis, Y-axis, and Z-axis. These three gradient coils generate and apply gradient magnetic fields to the object P in the respective directions of the X-axis, the Y-axis, and the Z-axis by using electric currents supplied from the respective channel power supplies 31*x*, 31*y*, and 31*z* of a gradient coil power supply 31 described below. The Z-axis direction is a direction along the static magnetic field, the Y-axis direction is the vertical direction, and the X-axis direction is the direction perpendicular to both the Z-axis and the Y-axis.

The WB coil 12 is shaped substantially in the form of a cylinder so as to surround the object P and is installed inside the gradient coil 11. The WB coil 12 functions as a transmitting coil. In other words, the WB coil 12 applies an RF pulse based on the RF signal transmitted from an RF transmitter 32 to the object P. In some cases, the WB coil 12 has a function as a receiving coil in addition to the function as a transmitting coil that transmits RF pulses. In that case, the WB coil 12 receives MR signals emitted from the object P due to the excitation of the atomic nuclei.

In the MRI apparatus 1, magnetic field adjustment for enhancing static magnetic field uniformity is performed by controlling an electric current value of the shim coil 13 on the basis of shimming data and thereby correcting static magnetic field non-uniformity. The magnetic field adjustment by the shim coil 13 may be performed by the gradient coil 11. The gradient coil 11 can correct the magnetic field by being provided with at least one shim coil that can adjust the magnetic field up to the higher-order terms of the coil spherical surface harmonics, for example. The gradient coil 11 may correct the magnetic field by being supplied with an offset current by the gradient coil power supply 31. The gradient coil 11 can perform the magnetic field adjustment for correcting static magnetic field non-uniformity and enhancing static magnetic field uniformity on the basis of shimming data.

The MRI apparatus 1 may include a local coil 20. The local coil 20 is disposed close to the body surface of the object P. The local coil 20 may include a plurality of coil elements. There are various models of the local coil 20 such as a head coil, a chest coil, an abdomen coil, a spine coil, and a knee coil. Although FIG. 1 illustrates a case where the local coil 20 is the chest coil, embodiments are not limited to such an aspect.

The local coil 20 functions as a receiving coil and receives MR signals. The local coil 20 may be a transmitting/receiving coil that has both the function to transmit RF pulses and the function to receive MR signals. In other words, the local coil 20 can be used for transmission only, for reception only, or for both transmission and reception.

The bed 500 includes a bed body 50 and a table 51. The bed body 50 can move the table 51 in the vertical direction and in the horizontal direction. The bed body 50 moves the table 51 with the object P placed thereon to a predetermined height, and then moves the table 51 in the horizontal direction so as to move the object P to the inside of the bore.

The control cabinet 300 includes the gradient coil power supply 31, the RF transmitter 32, an RF receiver 33, and a sequence controller 34.

The gradient coil power supply 31 is composed of: the channel power supply 31*x* for driving the gradient coil configured to generate the gradient magnetic field in the X-axis direction; the channel power supply 31*y* for driving the gradient coil configured to generate the gradient magnetic field in the Y-axis direction; and the channel power supply 31*z* for driving the gradient coil configured to generate the gradient magnetic field in the Z-axis direction. The gradient coil power supply 31 outputs a necessary electric current independently for each channel on the basis of instructions from the sequence controller 34.

The RF transmitter 32 generates RF signals on the basis of instructions from the sequence controller 34. The RF transmitter 32 transmits the generated RF signals to the WB coil 12 and/or the local coil 20.

The MR signals received by the WB coil 12 and/or the local coil 20 are transmitted to the RF receiver 33. The RF receiver 33 performs analog-to-digital (A/D) conversion of the MR signals acquired from the WB coil 12 and/or the local coil 20, and outputs the digitized MR signals to the sequence controller 34. Data of the digitized MR signals are sometimes referred to as raw data.

The sequence controller 34 performs a scan of the object P by driving the gradient coil power supply 31, the RF transmitter 32, and the RF receiver 33 under the control of the image processing device 400. After receiving the raw data acquired by the scan from the RF receiver 33, the sequence controller 34 then transmits the raw data to the image processing device 400.

The sequence controller 34 includes processing circuitry (not shown). This processing circuitry is configured as a processor that executes predetermined programs and/or hardware such as an FPGA (Field Programmable Gate Array) and an ASIC (Application Specific Integrated Circuit), for example.

Next, the image processing device 400 will be described. The image processing device 400 includes processing circuitry 40, a memory 41, a display 42, an input interface 43, and a communication circuit 44.

The processing circuitry 40 includes a special-purpose or general-purpose processor, and implements various functions by software processing that executes programs, which are stored in the memory 41 or directly incorporated into the processing circuitry 40. The processing circuitry 40 controls the operation of the sequence controller 34, and implements the function of generating MR images by performing a scan in accordance with a pulse sequence. The processing circuitry 40 may be composed of hardware such as an FPGA and an ASIC or may be configured by combining hardware processing and software processing so as to implement various functions.

The memory 41 is composed of a semiconductor memory element such as a RAM (Random Access Memory) and a flash memory, a hard disk, and an optical disc, for example. The memory 41 may be a portable medium such as a USB (Universal Serial Bus) memory and a DVD (Digital Video Disk). The memory 41 stores various processing programs to be executed by the processing circuitry 40, data required for executing the programs, and medical images.

The display 42 is composed of a liquid crystal display and/or an OLED (Organic Light Emitting Diode) display, for example. The display 42 displays various information items under the control of the processing circuitry 40. In addition to being a display device, the display 42 may also be a GUI (Graphical User Interface) that can receive various operations by the user, as exemplified by a touch panel.

The input interface 43 includes an input device and an input circuit. The input device is achieved by a trackball, a switch, a mouse, a keyboard, a touch pad, a touch screen, a non-contact input device using an optical sensor, and/or a voice input device, for example. When the input device is operated by the user, the input circuit generates an instruction signal corresponding to the operation, and outputs the instruction signal to the processing circuitry 40.

The communication circuit 44 includes an interface for wired or wireless communication connected to a network. The communication circuit 44 can exchange various data between the network and the memory 41, for example.

The image processing device 400 controls the entirety of the MRI apparatus 1 by using each of these components. Specifically, the processing circuitry 40 receives instructions and various information items including scan conditions through operations on the input device by the user such as a medical imaging technologist. The processing circuitry 40 causes the sequence controller 34 to perform a scan on the basis of the inputted scan conditions, and then reconstructs images on the basis of the raw data transmitted from the sequence controller 34. The reconstructed images are displayed on the display 42 and stored in the memory 41.

(Active Shimming)

In imaging using an MRI apparatus, uniformity of the static magnetic field is required to satisfactorily maintain quality of MR images. For example, uniformity of the static magnetic field is particularly required in regions away from the center of the static magnetic field magnet and/or regions that include air nearby in the imaging region, such as the neck, heart, breasts, lungs, elbows, and fingers. In some cases, uniformity of the static magnetic field is particularly required in specific imaging methods such as a fat suppression method, an MRS method, a CEST (Chemical Exchange Saturation Transfer) MRI method, an EPI (Echo Planar Imaging) method, and an SSFP (Steady State Free Precession) method.

Figure 2A:
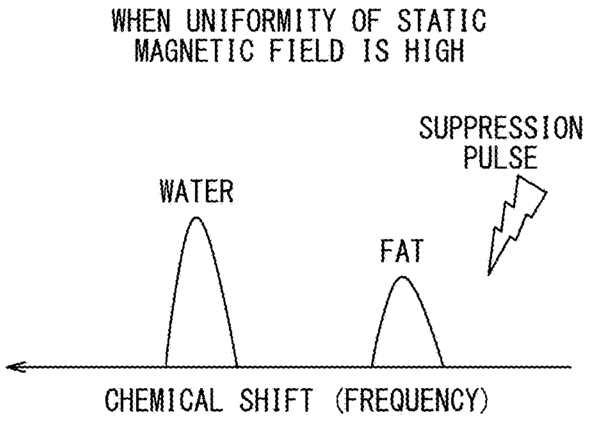
FIG. 2A and FIG. 2B are schematic waveform diagrams illustrating respective chemical shifts of water and fat when uniformity of a static magnetic field is different.
Figure 2B:
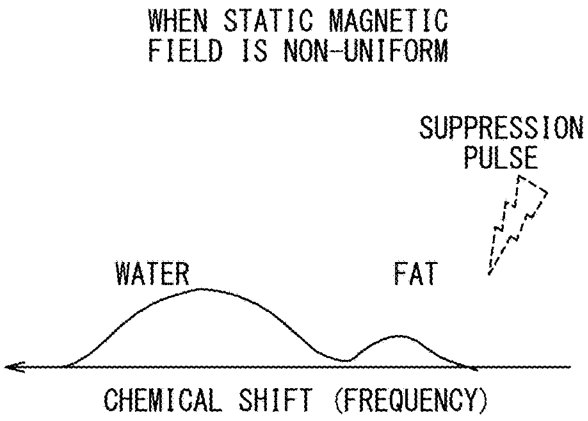

A detailed description will be given of the influence of static magnetic field non-uniformity in the case of the fat suppression method. As shown in FIG. 2A, when uniformity of the static magnetic field is high, a water signal and a fat signal are separated by difference in chemical shift, and thus, the fat can be frequency-selected and suppressed by applying a suppression pulse. As shown in FIG. 2B, when the static magnetic field is non-uniform, the difference in chemical shift does not satisfactorily work in terms of signal separation, the water signal and the fat signal partially overlap each other, so frequency-selective suppression of the fat by the suppression pulse is not possible.

Thus, in order to satisfactorily maintain image quality of MR images, a magnetic field adjustment technique called active shimming is known as a technique for enhancing the uniformity of the static magnetic field. In the active shimming, shimming data for correcting the static magnetic field non-uniformity are automatically or manually acquired under the state where an examinee is placed in the static magnetic field, before acquisition of MR data for imaging. For example, the shimming data are acquired by: applying a predetermined pulse sequence for acquiring the shimming data to actually acquire signals for measuring magnetic field distribution in a target region of the magnetic field adjustment; and expanding the magnetic field distribution for each magnetic field component subject to the magnetic field adjustment.

As described above, an electric current value of the shim coil 13 is controlled on the basis of the shimming data, and thereby, the magnetic field adjustment for correcting static magnetic field non-uniformity and enhancing uniformity of the static magnetic field is achieved by the shim coil 13. The shim coil 13 may be included in the gradient coil 11.

When the active shimming is performed, the uniformity of the static magnetic field is enhanced during acquisition of MR data for image generation, and the image quality of the MR images to be generated from these MR data is satisfactorily maintained. However, due to the movement of the object during the acquisition of the MR data for image generation, the magnetic field adjustment by the active shimming may be impaired and the uniformity of the static magnetic field may deteriorate. As a result, the quality of MR images to be generated from these MR data may deteriorate. As to processing for suppressing deterioration in the quality of the MR data caused by decrease in the uniformity of the static magnetic field during acquisition of the MR data, it will be hereinafter described as embodiments.

First Embodiment

Figure 3:
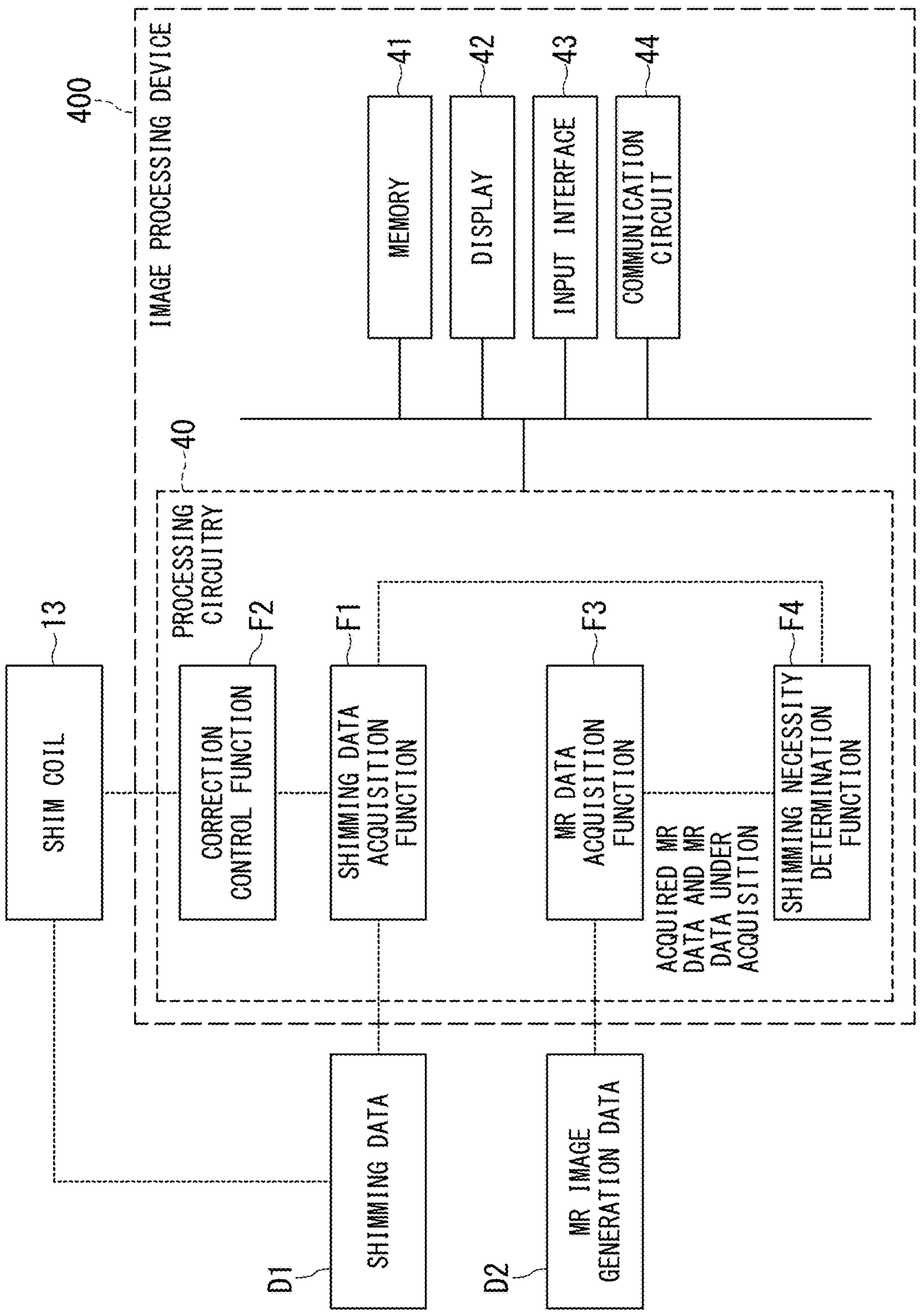
FIG. 3 is a block diagram illustrating a configuration of the MRI apparatus according to the first embodiment.

FIG. 3 is a block diagram illustrating a configuration of the MRI apparatus 1 according to the first embodiment. As shown in FIG. 3, the processing circuitry 40 of the MRI apparatus 1 according to the first embodiment implements each of a shimming data acquisition function F1, a correction control function F2, an MR data acquisition function F3, and a shimming necessity determination function F4.

Figure 4:
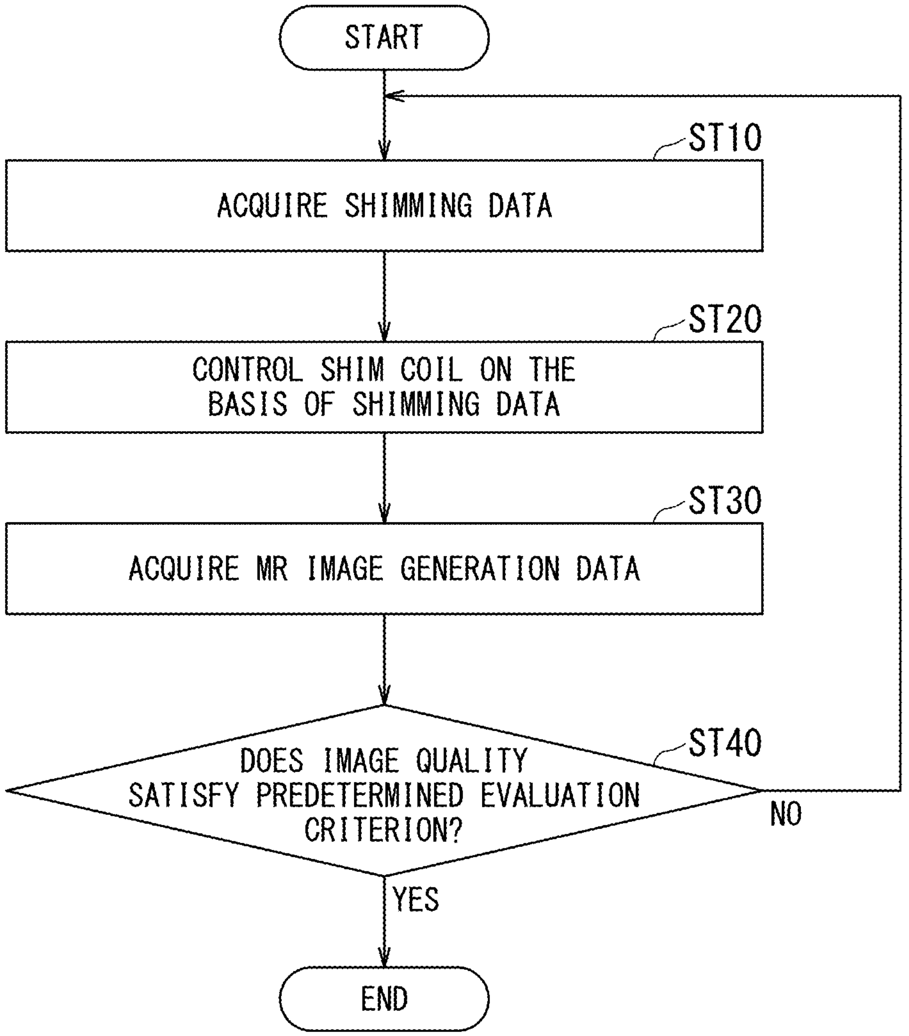
FIG. 4 is a flowchart illustrating processing to be performed by the MRI apparatus according to the first embodiment.

The operation of the processing circuitry 40 of the MRI apparatus 1 according to the first embodiment will be described by referring to the flowchart of FIG. 4. The object P is placed on the table 51 of the bed 500 and is placed in the static magnetic field. In the MRI apparatus 1, the scan conditions to be used in an imaging scan are set by user's operations via the input interface 43 or by reading out imaging protocols stored in the memory 41, for example.

In the step ST10, the shimming data acquisition function F1 acquires shimming data D1 for correcting the static magnetic field non-uniformity. For example, the shimming data D1 are acquired by: using a predetermined pulse sequence for acquiring the shimming data to actually acquire signals for measuring the magnetic field distribution in the target region of the magnetic field adjustment; and expanding the magnetic field distribution for each magnetic field component subject to shimming.

The target region of the magnetic field adjustment may be the entire imaging region or a local region within the imaging region. In other words, the shimming data acquisition function F1 acquires the shimming data D1 for correcting the static magnetic field non-uniformity with respect to either the entire imaging region or at least one of local regions within the imaging region.

In the step ST20, the correction control function F2 controls the electric current value of the shim coil 13 on the basis of the shimming data D1 in order to enhance the uniformity of the static magnetic field.

In the step ST30, the MR data acquisition function F3 acquires the MR image generation data D2 by execution of an imaging scan that acquires MR signals for generating an image of the object. The MR image generation data D2 are acquired by: applying a preset pulse sequence to perform the imaging scan based on various preset scan conditions; and thereby acquiring MR signals from the imaging region.

In the step ST40, on the basis of the MR image generation data D2 acquired by the MR data acquisition function F3, the shimming necessity determination function F4 determines whether to reacquire the shimming data D1 during the imaging scan or not. The MR image generation data D2 include both acquired MR image generation data already acquired in the imaging scan and MR image generation data that are being acquired in the imaging scan.

The acquired MR image generation data are referred to as data that have already been acquired as the MR image generation data and the acquisition is completed. The MR image generation data that are being acquired are data for which acquisition has not yet been completed, and are hereinafter referred to as "the MR image generation data under acquisition". The acquired MR image generation data and the MR image generation data under acquisition respectively include both data that can satisfactorily maintain quality of an MR image and data that cannot maintain quality of an MR image, when generating MR image from these data.

The determination to reacquire the shimming data D1 during the imaging scan is made by determining whether the image quality satisfies one or more predetermined evaluation criteria or not. If the quality of each image to be generated from the acquired MR image generation data and the MR image generation data under acquisition through the imaging scan does not satisfy one or more predetermined evaluation criteria (i.e., NO in the step ST40), the shimming necessity determination function F4 reacquires the shimming data D1.

The shimming necessity determination function F4 may use at least one metric among an SSIM (Structural Similarity Index Measure), a PSNR (Peak Signal to Noise Ratio), a NMSE (Normalized Mean Squared Error), and an MSE (Mean Squared Error) for determining whether the quality of the image satisfies the predetermined evaluation criterion or not. For example, the determination may be made on the basis of whether at least one metric among the SSIM, PSNR, NMSE, and MSE satisfies a predetermined reference value having been set in advance or not.

If the shimming necessity determination function F4 determines to reacquire the shimming data D1, i.e., if the image quality does not satisfy the predetermined evaluation criterion, the shimming data acquisition function F1 reacquires the shimming data D1 during the imaging scan. In other words, if the determination result is NO in the step ST40, the processing returns to the step ST10.

Subsequently, in the step ST20, the correction control function F2 controls the electric current value of the shim coil 13 during the imaging scan on the basis of the reacquired shimming data D1.

In the next step ST30, the MR data acquisition function F3 reacquires part or all of the MR image generation data D2. In the next step ST40, if the shimming necessity determination function F4 determines that reacquisition of the shimming data D1 is unnecessary, i.e., if the image quality satisfies the predetermined evaluation criterion (YES), the processing of the flowchart of FIG. 3 is completed.

According to the MRI apparatus 1 in the first embodiment, when the image quality of the image to be generated from the MR image generation data is not satisfactorily maintained, the magnetic field adjustment is performed again, and thus, deterioration in the quality of the MR data due to decrease in the uniformity of the static magnetic field can be suppressed.

First Modification of First Embodiment

Figure 5:
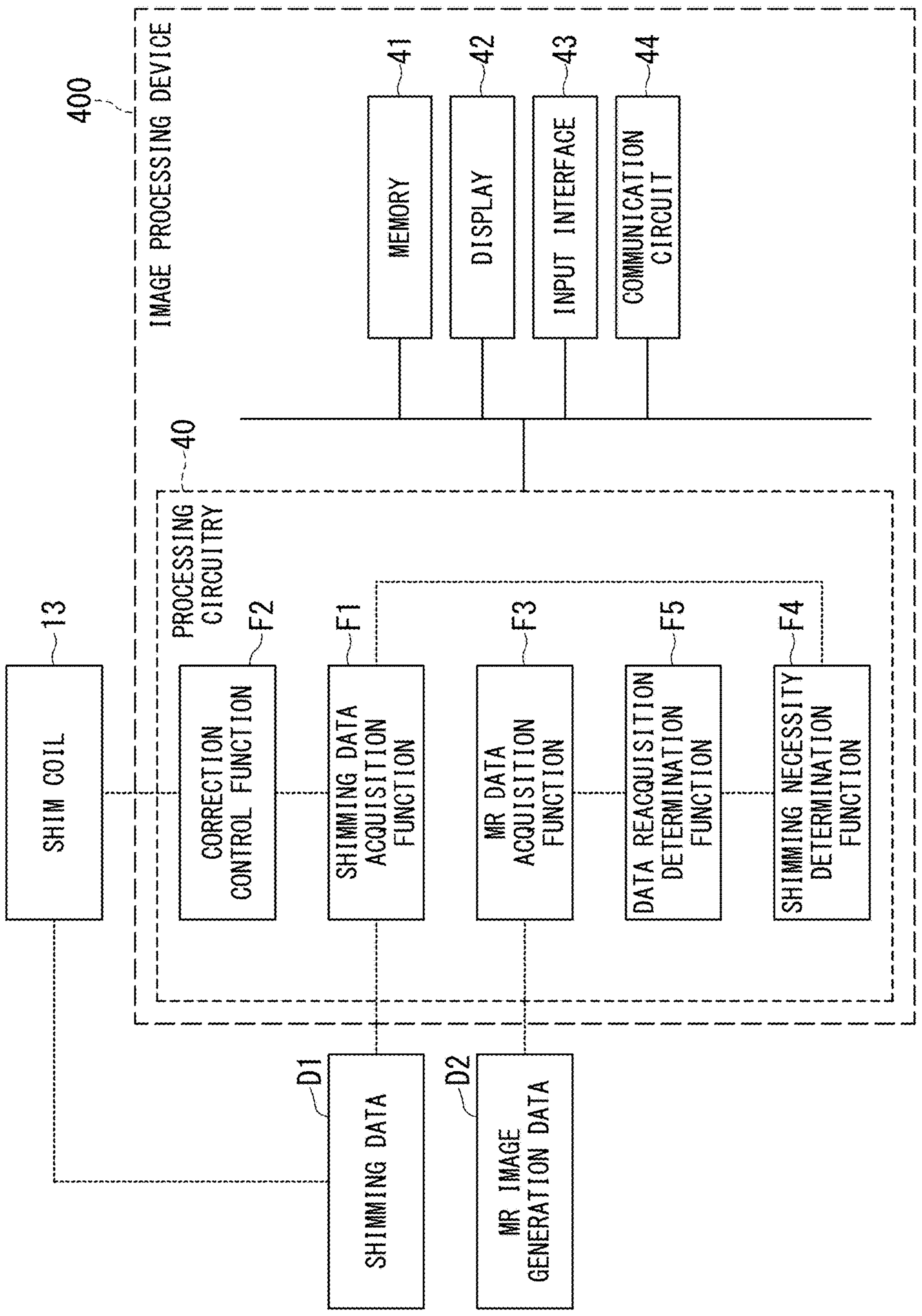
FIG. 5 is a block diagram illustrating a configuration of the MRI apparatus according to the first modification of the first embodiment.

FIG. 5 is a block diagram illustrating a configuration of the MRI apparatus 1 according to the first modification of the first embodiment. As shown in FIG. 5, the processing circuitry 40 of the MRI apparatus 1 according to the first modification of the first embodiment differs from the MRI apparatus 1 according to the first embodiment in that the configuration of the first modification further implements a data reacquisition determination function F5. Since the other configurations and functions are not substantially different from the MRI apparatus 1 according to the first embodiment shown in FIG. 3, the same components as those in the first embodiment are denoted by the same reference signs and duplicate descriptions are omitted. The operation of the processing circuitry 40 of the MRI apparatus 1 according to the first modification of the first embodiment will be described by referring to the flowchart of FIG. 6.

The steps ST10, ST20, and ST30 by the MRI apparatus 1 according to the first modification of the first embodiment are not substantially different from the respective steps ST10, ST20, and ST30 by the MRI apparatus 1 according to the first embodiment, and duplicate descriptions are omitted. After the step ST30, the processing proceeds to the step ST35.

In the step ST35, the data reacquisition determination function F5 evaluates artifacts in the image to be generated from the MR image generation data D2 acquired by the MR data acquisition function F3 during the imaging scan, and then determines whether to reacquire part or all of the MR image generation data D2 or not. If the data reacquisition determination function F5 determines that the evaluation criterion regarding artifacts is not satisfied, the MR data acquisition function F3 reacquires part or all of the MR image generation data D2.

Figure 7:
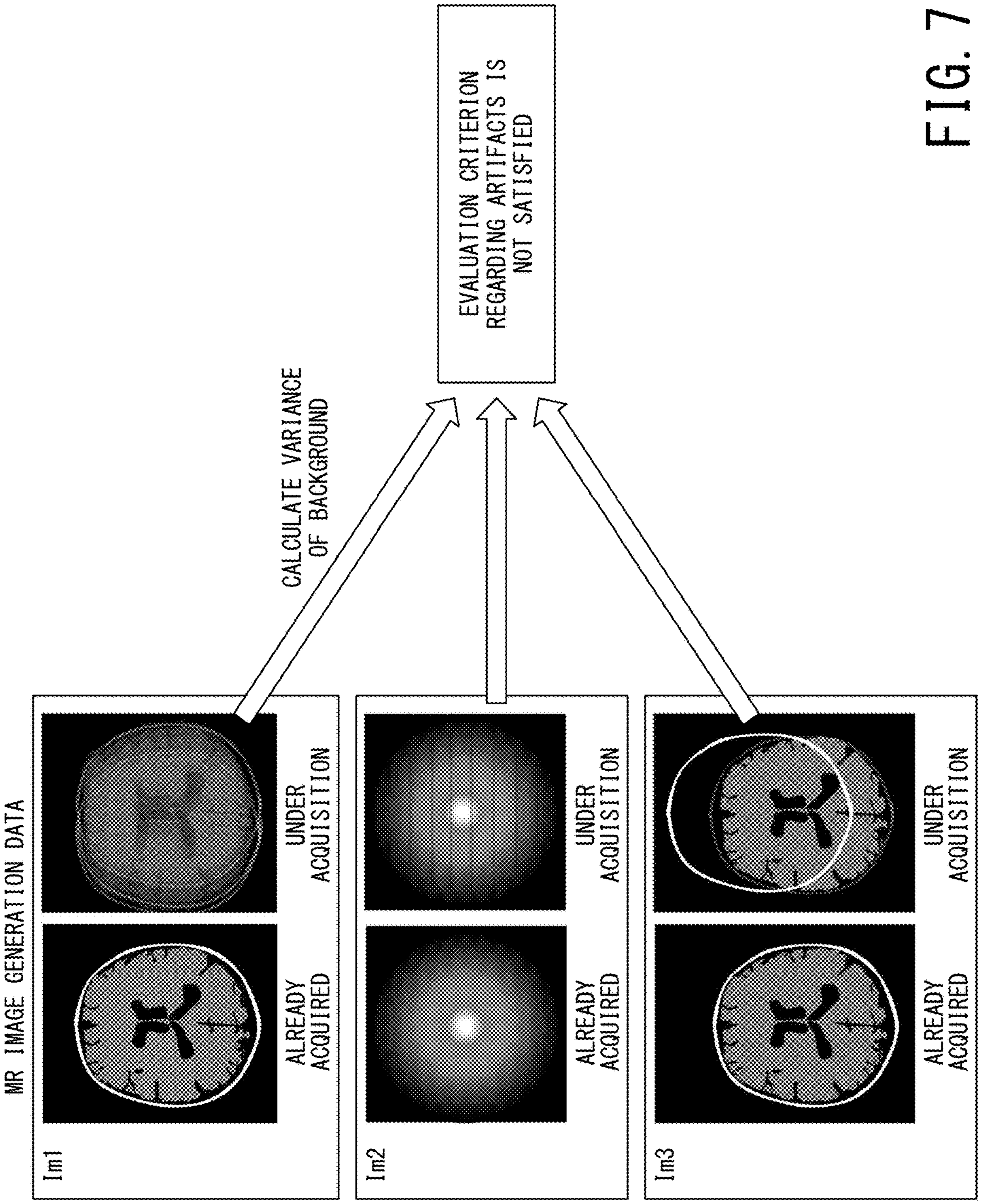
FIG. 7 is a schematic diagram illustrating a case where an evaluation criterion regarding artifacts is not satisfied.

By referring to FIG. 7, a description will be given of a case where the MR image generation data under acquisition do not satisfy the evaluation criterion regarding artifacts. FIG. 7 illustrates a case where images to be generated from the acquired MR image generation data (i.e., three images on the left side of Im1, Im2, Im3 in FIG. 7) satisfy the evaluation criterion regarding artifacts and images to be generated from the MR image generation data under acquisition (i.e., three images on the right side of Im1, Im2, Im3 in FIG. 7) do not satisfy the evaluation criterion regarding artifacts.

The image Im1 illustrates one schematic image in the imaging region where the k-space is filled with Cartesian data when there is movement of the object P during the acquisition of the MR image generation data. It is shown in the image Im1 that a motion artifact due to movement of the object P appears as a ghost positionally shifted in the phase encoding direction.

The image Im2 illustrates one schematic image in the K-space region filled with Cartesian data when there is influence due to a chemical shift during the acquisition of the MR image generation data.

The image Im3 illustrates one schematic image in the imaging region where the k-space is filled with data having a traversable zigzag data-filling trajectory unique to an EPI method when there is influence due to a chemical shift during the acquisition of the MR image generation data. The image Im3 shows a chemical-shift artifact as the positional deviation in the phase encoding direction.

The EPI method is a high-speed imaging method in which the gradient magnetic field in the frequency encoding direction is large. In the EPI method, in order to widen the bandwidth per pixel to, for example, 1000 Hz or more, the chemical shift is kept within one pixel. In other words, in the EPI method, pixel shifts in the frequency encoding direction due to chemical shifts are unlikely to occur in images. In addition, the gradient magnetic field in the phase encoding direction is smaller in strength than the gradient magnetic field in the frequency encoding direction, and the frequency band is narrow, for example, about 10 Hz. However, the k-space is filled with data having the traversable zigzag data-filling trajectory in the EPI method. Thus, even if the phase shift in one phase encode column in the k-space is small in the EPI method, such a phase shift accumulates when moving to the next phase encode column, and a large positional shift in the phase encode direction appears.

In addition to the cases of the images Im1 to Im3, if there is movement of the object P during the acquisition of the MR image generation data, in the imaging region where the k-space is filled with data having a spiral data-filling trajectory, motion artifacts appear in a spiral pattern. In this manner, the direction and/or pattern in which artifacts are detected differ depending on the imaging method and k-space filling trajectory. In addition, the direction and/or pattern in which artifacts are detected has a certain tendency depending on the imaging method and the k-space filling trajectory, for example.

Although the spin echo method and the EPI method are illustrated as aspects of imaging methods for the imaging scan, the applicable imaging methods are not limited to these but include known two-dimensional or three-dimensional imaging methods such as the FSE method, the GRE method, the SSFP method, and the fat suppression method. Although the data-filling trajectory in the k-space is illustrated as a Cartesian, spiral, or traversable zigzag data-filling trajectory, the embodiments are not limited to these but include other known data-filling trajectory such as a radial one.

In the MR image generation data, the direction and/or pattern in which artifacts are detected differs depending on the imaging method and the k-space filling trajectory, for example. In the case of the images Im1 to Im3, the variance of the background is different between the acquired MR image generation data for which data acquisition has been completed and the MR image generation data under acquisition for which data acquisition has not yet been completed.

Accordingly, in the step ST35, the data reacquisition determination function F5 calculates the variance of the background in an image of at least one of the imaging region and the k-space region to be generated from the MR image generation data D2 acquired by the MR data acquisition function F3, and determines whether to reacquire part or all of the MR image generation data D2 or not.

As described above, the direction and/or pattern in which artifacts are detected has a certain tendency depending on the imaging method and the k-space data filling trajectory, for example. Hence, evaluation regarding artifacts can be performed on the basis of the variance of the background of an image. For example, the evaluation regarding artifacts may be performed by using a trained model based on the variance of the background of an image. On the basis of the evaluation result regarding artifacts, it can be determined whether to reacquire part or all of the MR image generation data D2 or not.

This determination is made after elapse of a certain period of time from the start of acquisition of the MR image generation data. This determination can be made on the condition that both the acquired MR image generation data and the MR image generation data under acquisition are available. This determination may be made before acquisition of the MR image generation data for data addition or may be made for each slice or every plural number of slices in a multi-slice imaging scan, for example.

Figure 6:
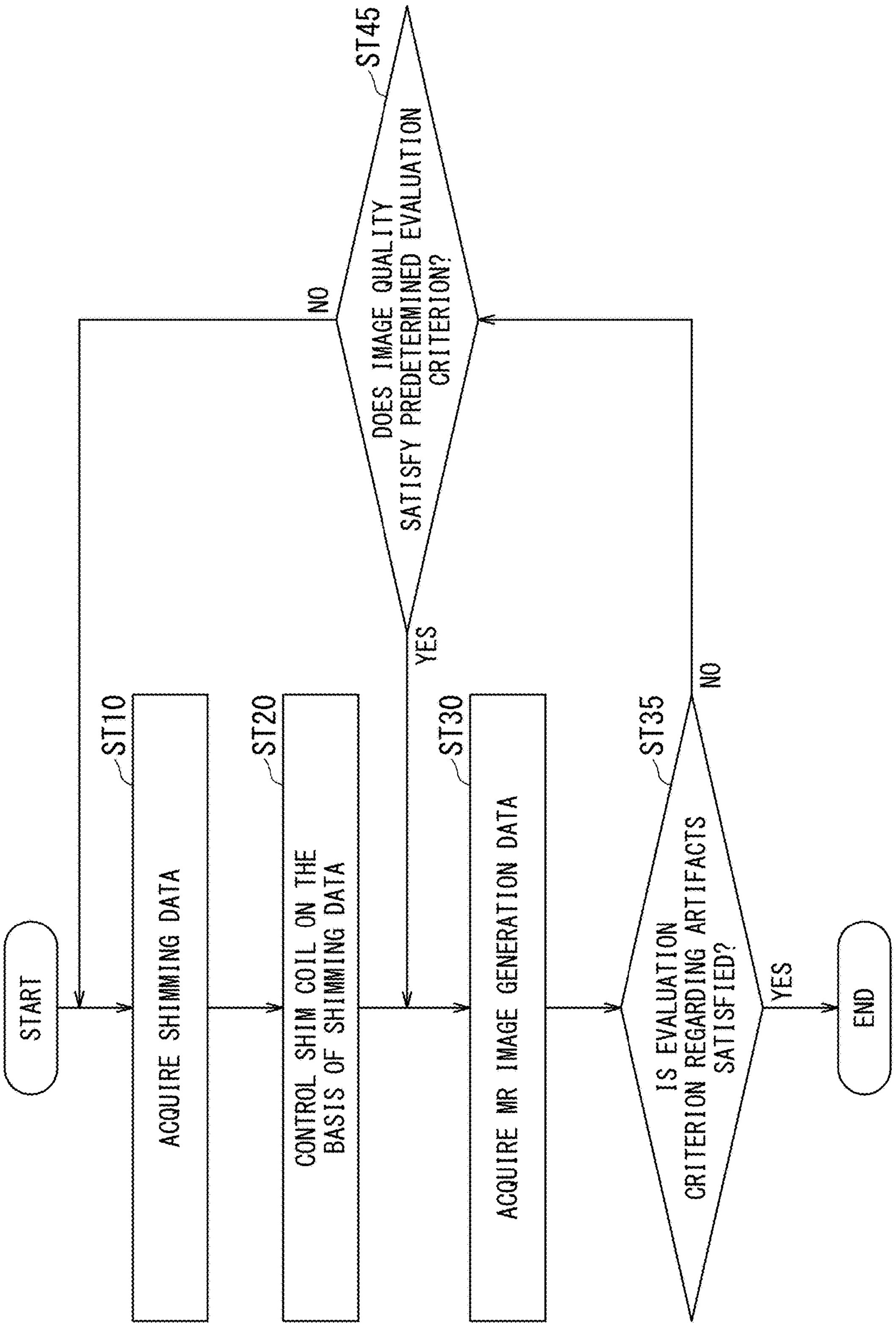
FIG. 6 is a flowchart illustrating processing to be performed by the MRI apparatus according to the first modification of the first embodiment.

If the data reacquisition determination function F5 determines in the step ST35 that the evaluation criterion regarding artifacts is satisfied (YES), the processing of the flowchart of FIG. 6 is completed. Conversely, if the data reacquisition determination function F5 determines in the step ST35 that the evaluation criterion regarding artifacts is not satisfied (NO), the processing proceeds to the step ST45. The evaluation criterion regarding artifacts may be stored in the memory 41 in advance.

In the MRI apparatus 1 according to the first modification of the first embodiment, if the shimming necessity determination function F4 determines in the step ST45 that reacquisition of the shimming data D1 is unnecessary (YES), the processing proceeds to the step ST30. In other words, without reacquiring the shimming data D1, the MR data acquisition function F3 reacquires part or all of the MR image generation data D2.

The step ST45 is not substantially different from the step ST40 by the MRI apparatus 1 according to the first embodiment. In other words, in the step ST45, the shimming necessity determination function F4 determines whether to reacquire the shimming data D1 during the imaging scan or not, on the basis of the MR image generation data D2 acquired by the MR data acquisition function F3. If the shimming necessity determination function F4 determines to reacquire the shimming data D1, the shimming data acquisition function F1 reacquires the shimming data D1. In other words, if the determination result in the step ST45 is NO, the processing returns to the step ST10. In the subsequent step ST20, the correction control function F2 controls the electric current value of the shim coil 13 on the basis of the reacquired shimming data D1. In the next step ST30, the MR data acquisition function F3 reacquires part or all of the MR image generation data D2.

Second Modification of First Embodiment

Figure 8:
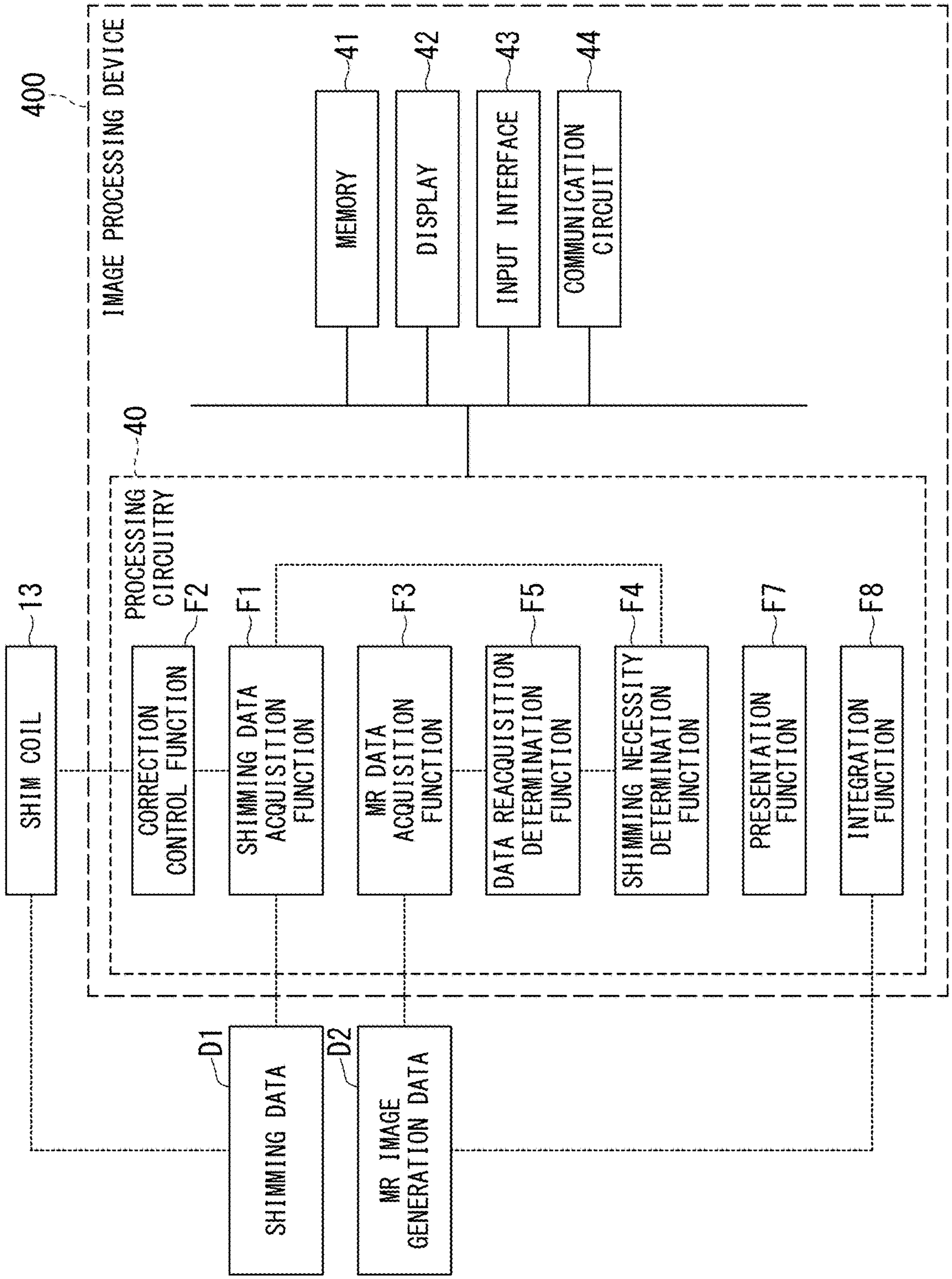
FIG. 8 is a block diagram illustrating a configuration of the MRI apparatus according to the second modification of the first embodiment.

FIG. 8 is a block diagram illustrating a configuration of the MRI apparatus 1 according to the second modification of the first embodiment. As shown in FIG. 8, the processing circuitry 40 of the MRI apparatus 1 according to the second modification of the first embodiment differs from the MRI apparatus 1 according to the first modification of the first embodiment in that the second modification further implements a presentation function F7 and an integration function F8. Since the other configurations and functions are not substantially different from the MRI apparatus 1 according to the first modification of the first embodiment shown in FIG. 5, the same components as those in the first modification are denoted by the same reference signs and duplicate descriptions are omitted. The operation of each of the function F1 to F6 of the processing circuitry 40 of the MRI apparatus 1 according to the second modification of the first embodiment is not substantially different from the operation shown in the flowchart of FIG. 6 of the MRI apparatus 1 according to the first modification of the first embodiment, and duplicate descriptions are omitted.

In the MRI apparatus 1 according to the second modification of the first embodiment, the presentation function F7 may present at least two of the options (a), (b), and (c) as follows such that at least one of them can be selected. In the option (a), reacquisition of the MR image generation data D2 and integration of the reacquired data and the acquired data are automatically performed. In the option (b), reacquisition of the MR image generation data D2 is automatically performed and integration of the reacquired data and the acquired data is determined after the reacquisition. In the option (c), reacquisition of the MR image generation data D2 is not automatically performed. In accordance with such presentation, the user may decide in advance whether to reacquire the MR image generation data D2 (i.e., in the step ST30) and to integrate the reacquired data and the acquired data. The user may make the decision via the input interface 43, for example. Note that correction processing such as registration may be performed between the data before data integration. The presentation by the presentation function F7 may be performed before start of the processing of the flowchart of FIG. 6, for example.

For example, if it is determined to automatically perform reacquisition of the MR image generation data D2, in the flowchart of FIG. 6, part or all of the MR image generation data D2 are reacquired in the step ST30. Conversely, if it is determined that reacquisition of the MR image generation data D2 is not automatically performed, the processing of the step ST30 is not performed.

In addition, the integration function F8 integrates the reacquired data and the acquired data. The data integration by the integration function F8 is performed after completion of the processing shown in the flowchart of FIG. 6, for example. The integration of the reacquired data and the acquired data may be automatically performed in accordance with the user's decision. After the reacquisition of the MR image generation data D2, the presentation function F7 may further present options on whether to integrate the reacquired data and the acquired data or not so that the user can make further decision.

According to the MRI apparatus 1 of the first and second modifications of the first embodiment, when the image quality of images to be generated from the MR image generation data is not satisfactorily maintained, the magnetic field adjustment is performed again, and thus, deterioration in the quality of MR data due to decrease in the uniformity of the static magnetic field during the imaging scan can be suppressed. In addition, if the quality of MR data deteriorates due to factors irrelevant to the decrease in the uniformity of the static magnetic field, such as a motion of the object and a chemical shift, the MR image generation data D2 are reacquired without reperforming the magnetic field adjustment. Thus, deterioration in the quality of MR data can be suppressed without necessarily extending the scanning time length.

Second Embodiment

Figure 9:
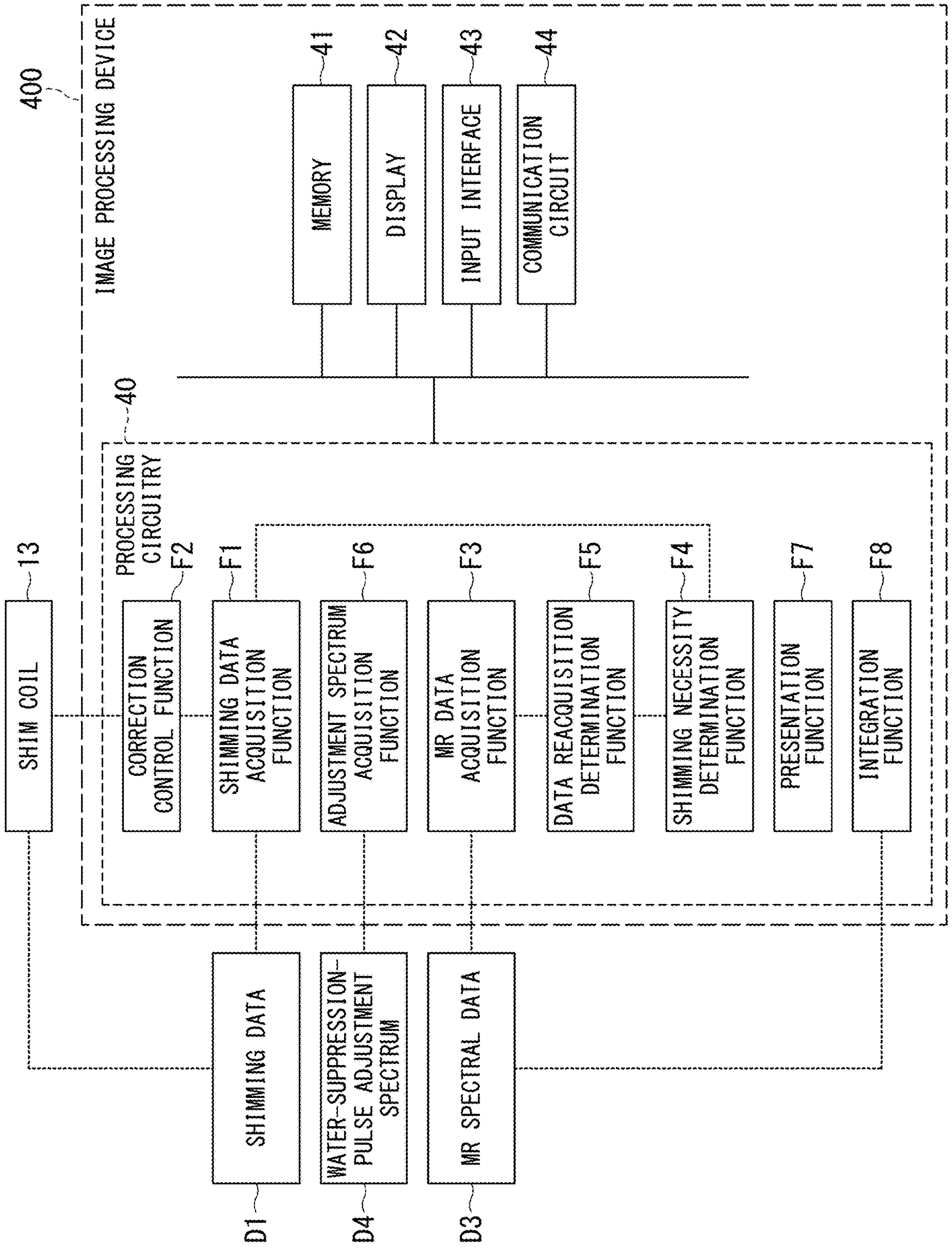
FIG. 9 is a block diagram illustrating a configuration of the MRI apparatus according to the second embodiment.

FIG. 9 is a block diagram illustrating a configuration of the MRI apparatus 1 according to the second embodiment. As shown in FIG. 9, the processing circuitry 40 of the MRI apparatus 1 according to the second embodiment implements each of the shimming data acquisition function F1, the correction control function F2, the MR data acquisition function F3, the shimming necessity determination function F4, the data reacquisition determination function F5, the adjustment spectrum acquisition function F6, and the presentation function F7. Note that the processing circuitry 40 of the MRI apparatus 1 according to the second embodiment may further implement the integration function F8. The operation of the processing circuitry 40 of the MRI apparatus 1 according to the second embodiment will be described by referring to the flowchart of FIG. 10.

Note that the imaging scan for acquiring the MR image generation data D2 is performed in the first embodiment, while an MRS scan for acquiring MR spectral data D3 is performed in the second embodiment.

The results of the MRS scan are expressed as spectra with the horizontal axis representing the chemical shift (frequency) from the reference substance and the vertical axis representing the signal intensity. In the MRS scan, for example, type and concentration of metabolites in living organisms can be investigated by analyzing the differences in the frequency of atomic nuclei due to differences in molecular structure. Although a description will be given of a case where the MR spectral data D3 to be acquired are data for generating metabolite spectra, data for generating the water reference spectrum, or data for generating both. Note that the water reference spectrum is a spectrum without water suppression.

The object P is placed on the table 51 of the bed 500 and is placed in the static magnetic field. In the MRI apparatus 1, scan conditions for the MRS scan are set by user operations or by reading out the imaging protocols stored in the memory 41, for example.

In the step ST110, the shimming data acquisition function F1 acquires the shimming data D1 for correcting the static magnetic field non-uniformity. For example, the shimming data D1 are acquired by: applying a predetermined pulse sequence for acquiring the shimming data to actually acquire signals for measuring the magnetic field distribution in the target region of the magnetic field adjustment; and expanding the magnetic field distribution for each magnetic field component subject to shimming.

The target region of the magnetic field adjustment may be the entire imaging region, a local region within the imaging region, or both of them. In other words, the shimming data acquisition function F1 acquires the shimming data D1 for correcting the static magnetic field non-uniformity with respect to the entire imaging region or at least one local region within the imaging region.

In the step ST120, the correction control function F2 controls the electric current value of the shim coil 13 for enhancing the uniformity of the static magnetic field on the basis of the shimming data D1.

In the step ST130, the adjustment spectrum acquisition function F6 acquires the water-suppression-pulse adjustment spectrum D4 by the MRS scan in which the spectra of the object are detected. Each metabolite such as choline, creatine, and NAA (N-acetylaspartic acid) in the object to be observed in the MRS scan is smaller in signal intensity than that in free water. Thus, in order to reduce the influence of the free water when detecting weak metabolite signals, there is a technique using a water suppression pulse to reduce the signal intensity of the free water. In order to satisfactorily achieve water suppression, an adjustment spectrum is acquired using the RF intensity for the water suppression pulse.

In the step ST140, the MR data acquisition function F3 acquires the MR spectral data D3 by the MRS scan that detects the spectra of the object. The MR spectral data D3 are acquired by: using a preset pulse sequence for the MRS scan and various preset scan conditions; and acquiring MR signals in the imaging region.

In the step ST150, the data reacquisition determination function F5 evaluates spectral imperfection during the MRS scan on the basis of the MR spectral data acquired by the MR data acquisition function F3. The evaluation of spectral imperfection is performed on the spectra that are generated on the basis of the acquired MR spectral data and the MR spectral data that are being acquired. The MR spectral data that are being acquired hereinafter referred to as the MR spectral data under acquisition.

The acquired MR spectral data are data that have been acquired and the acquisition is completed. The MR spectral data under acquisition are data for which the acquisition has not yet been completed. The acquired MR spectral data and the MR spectral data under acquisition respectively include both data of satisfactory spectra and data of imperfect spectra.

The data reacquisition determination function F5 performs the evaluation of spectral imperfection in the step ST150 by calculating the spectral variance on the basis of the MR spectral data D3 acquired by the MR data acquisition function F3.

In the MRS scan, a plurality of MR spectral data are generally acquired and added to improve the signal to noise ratio (SNR). Thus, whether each spectrum is imperfect or not may be evaluated by the variance of the spectrum acquired by comparing spectra generated from a plurality of or all of the acquired MR spectral data and spectra generated from the MR spectral data under acquisition. Further, such evaluation can be made based on the variance of the spectrum acquired by comparing the spectrum generated from at least one acquired MR spectral datum and spectrum generated from the MR spectral data under acquisition. Note that the evaluation of spectral imperfection may be performed by using a trained model.

The evaluation of spectral imperfection based on the MR spectral data is performed after elapse of a certain period of time from the start of acquisition of the MR spectral data. The evaluation can be performed on the condition that both the acquired MR spectral data and the MR spectral data under acquisition are available.

In the step ST160, the data reacquisition determination function F5 evaluates imperfection of the spectral to be generated from the MR spectral data D3 acquired by the MR data acquisition function F3 during the MRS scan, and then determines whether to reacquire part or all of the MR spectral data D3 or not. The spectral imperfection is evaluated by presenting, for example, numbering of the imperfect spectrum, the total number of imperfect spectra. The numbering of the imperfect spectrum refers to the addition number (i.e., addition count) in the addition of the MR spectral data.

Figure 11:
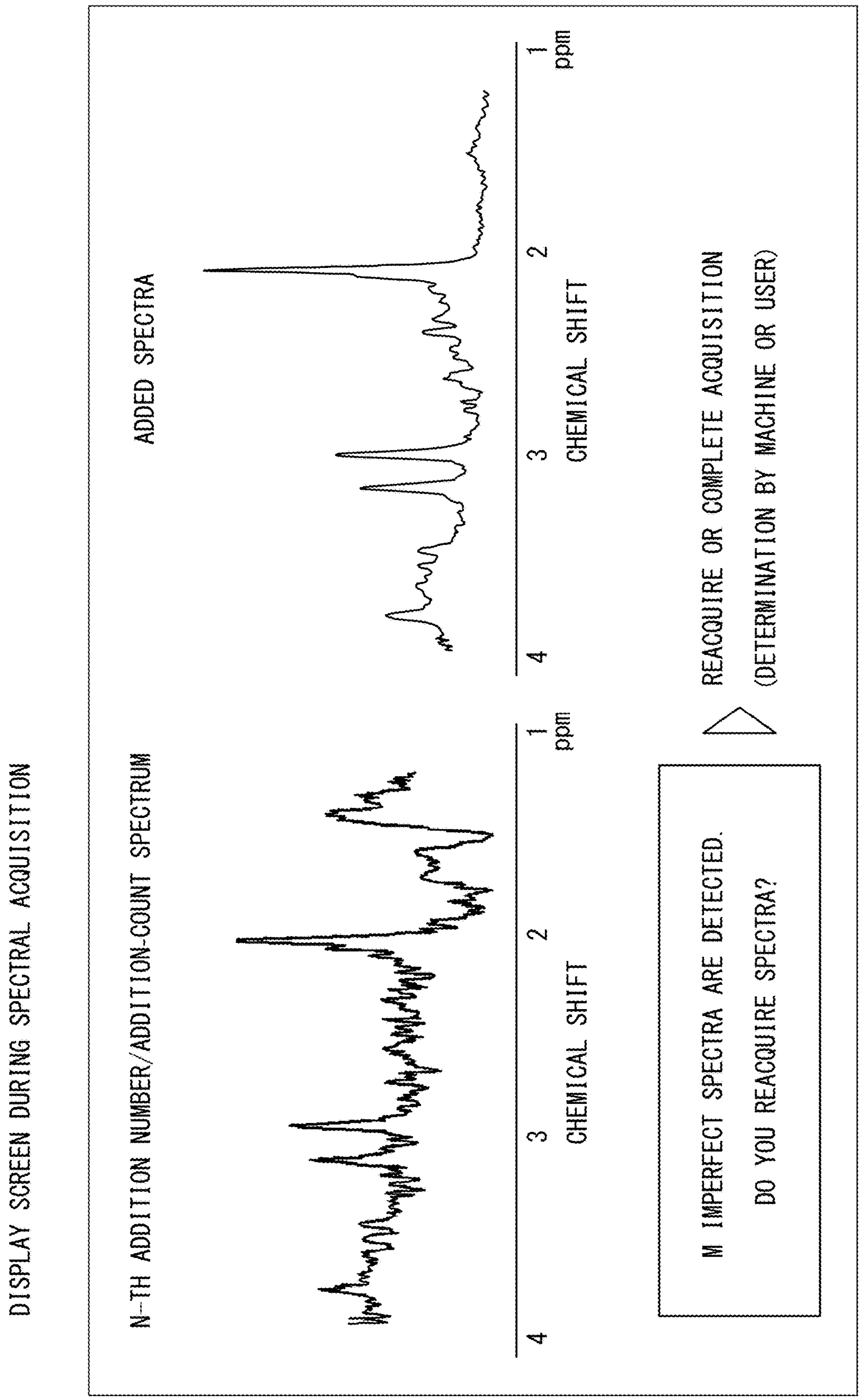
FIG. 11 is a schematic diagram illustrating a display screen of spectra that are generated on the basis of MR spectral data acquired by the MRI apparatus according to the second embodiment.

FIG. 11 is a schematic diagram illustrating a display screen during acquisition of spectra that are generated on the basis of the MR spectral data D3. As shown in FIG. 11, during the acquisition of the MR spectral data D3, the added spectra based on the acquired MR spectral data may be displayed. It may also display the MR spectral data under acquisition being the spectrum for the N-th addition, wherein N is a natural number. The spectra are displayed on the display 42, for example.

If the data reacquisition determination function F5 determines that the MR spectral data acquired by the MR data acquisition function F3 do not satisfy the evaluation criterion regarding spectral imperfection, the presentation function F7 may present this information. FIG. 11 illustrates a case in which M of MR spectral data being imperfect spectra are detected, wherein M is defined as a natural number smaller than the total number of the acquired MR spectral data.

In this case, if the data reacquisition determination function F5 determines that the evaluation criterion regarding spectral imperfection is not satisfied, the MR data acquisition function F3 reacquires part or all of the MR spectral data D3. For example, on the basis of whether the proportion of imperfect MR spectral data (M in FIG. 11) to the total number of the acquired MR spectral data exceeds a predetermined reference value or not, it may be determined whether the evaluation criterion regarding spectral imperfection is satisfied or not, and then whether to reacquire the MR spectral data can be determined.

Additionally, the user may decide whether to reacquire the M of MR spectral data that are imperfect spectra. In this case, for example, the presentation function F7 may present at least two of the options (a), (b), and (c) as follows such that one of the options can be selected. In the option (a), reacquisition of the MR spectral data D3 and integration of the reacquired data and the acquired data are automatically performed. In the option (b), reacquisition of the MR spectral data D3 is automatically performed and integration of the reacquired data and the acquired data is determined after the reacquisition. In the option (c), reacquisition of the MR spectral data D3 is not automatically performed. In accordance with this presentation, the user may decide in advance whether to reacquire the MR spectral data D3 (i.e., in the step ST140) and to integrate the reacquired data and the acquired data. The user may make the decision via the input interface 43, for example. Note that correction processing such as registration may be performed between the data before data integration. The presentation by the presentation function F7 is performed before the start of the processing shown in the flowchart of FIG. 10, for example.

Figure 10:
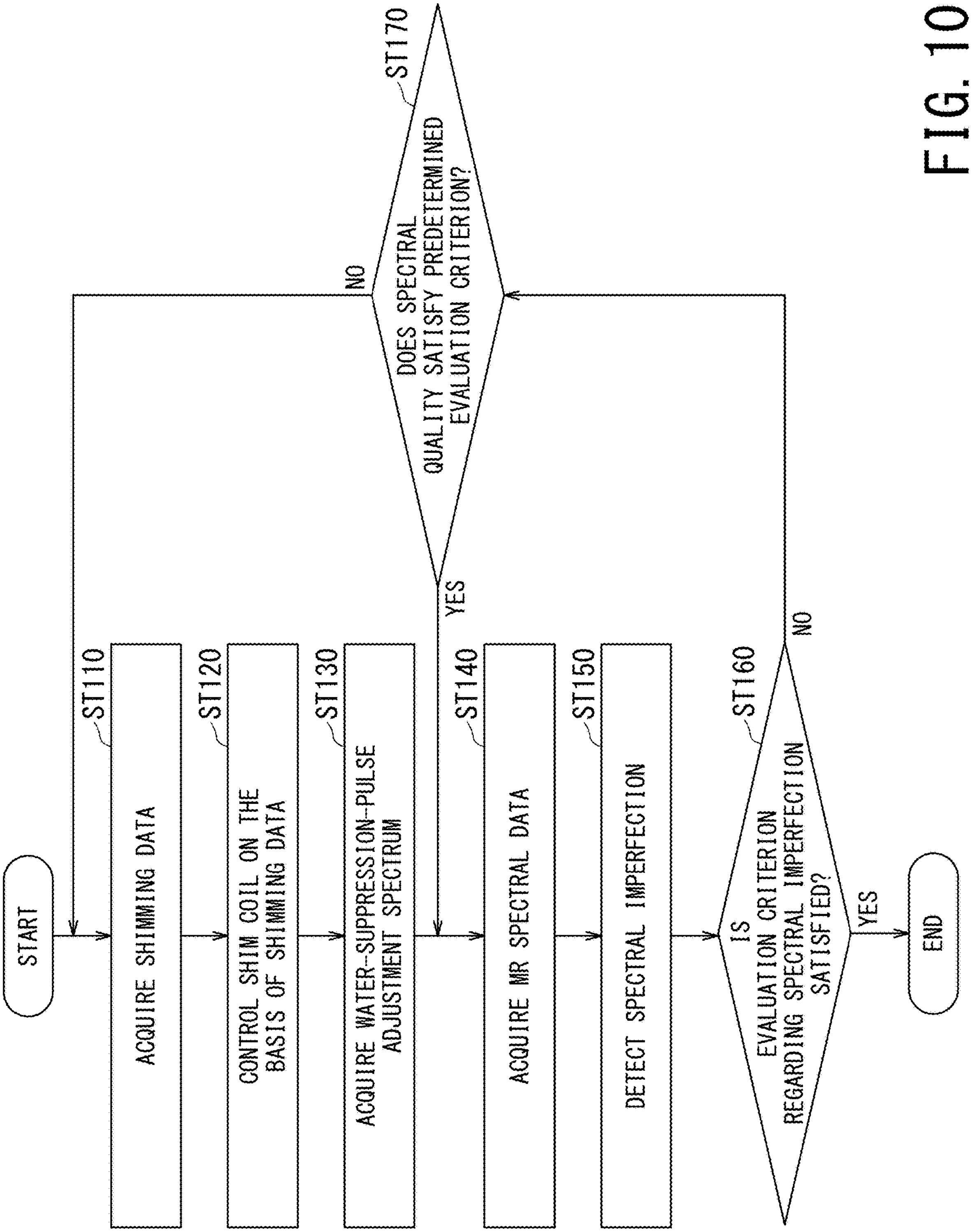
FIG. 10 is a flowchart illustrating processing to be performed by the MRI apparatus according to the second embodiment.

For example, if it is determined to automatically perform reacquisition of the MR spectral data D3, in the flowchart of FIG. 10, part or all of the MR spectral data D3 are reacquired in the step ST140. Conversely, if it is determined that reacquisition of the MR spectral data D3 is not automatically performed, the processing of the step ST140 is not performed.

Note that the MR spectral data D3 to be acquired may be data for generating metabolite spectra, data for generating water reference spectra, or data for generating both. In the step ST160, if the MR data acquisition function F3 reacquires part or all of the MR spectral data, data for generating metabolite spectra may be acquired, data for generating water reference spectra may be acquired, or data for generating both may be acquired.

Returning to FIG. 10, in the step ST170, the shimming necessity determination function F4 determines whether to reacquire the shimming data D1 during the MRS scan or not, on the basis of the MR spectral data D3 acquired by the MR data acquisition function F3. The MR spectral data D3 acquired by the MR data acquisition function F3 include the acquired MR spectral data and the MR spectral data under acquisition in the MRS scan.

The determination on whether to reacquire the shimming data D1 during the MRS scan is made based on whether the spectral quality satisfies the predetermined evaluation criterion or not, for example. In the step ST170, if quality of the spectra generated on the basis of the acquired MR spectral data and the MR spectral data under acquisition in the MRS scan does not satisfy the predetermined evaluation criterion (i.e., NO), the shimming necessity determination function F4 reacquires the shimming data D1.

The shimming necessity determination function F4 may determine whether the spectral quality satisfies the predetermined evaluation criterion or not, by using at least one of the following metrics: a signal-to-noise ratio (SNR), a half-bandwidth, and curve fitting accuracy.

FIG. 12 to FIG. 14C are schematic waveform diagrams illustrating quality evaluation of spectra generated on the basis of the MR spectral data D3 under acquisition. A description in order will be given for the case where the signal-to-noise ratio, the half bandwidth, and the curve fitting accuracy is applied for determining whether the quality of a spectrum satisfies the predetermined evaluation criterion or not.

Figure 12:
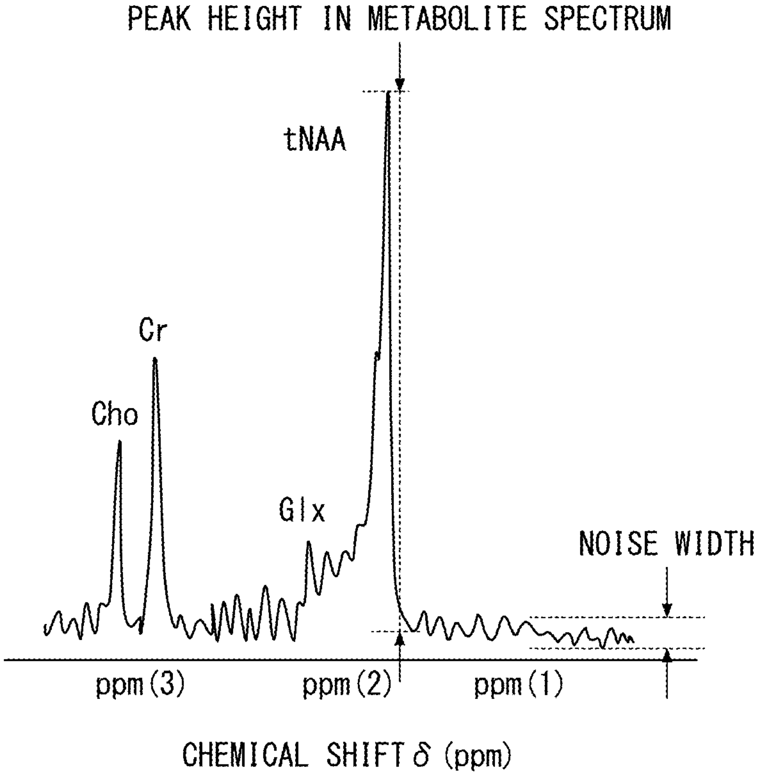
FIG. 12 is a schematic waveform diagram illustrating a first case of spectral quality evaluation of the MRI apparatus according to the second embodiment.

FIG. 12 illustrates the case of using the SNR as the metric to determine whether the spectral quality satisfies the predetermined evaluation criterion or not. As shown in FIG. 12, the SNR is the height of the peak in the metabolite spectrum with respect to twice the root mean square of the noise width in the frequency domain in which artifacts and peaks of the metabolite spectra do not exist. Depending on whether the SNR satisfies the predetermined reference value set in advance or not, whether the spectral quality satisfies the predetermined evaluation criterion or not can be determined.

Figures 13A, 13B:
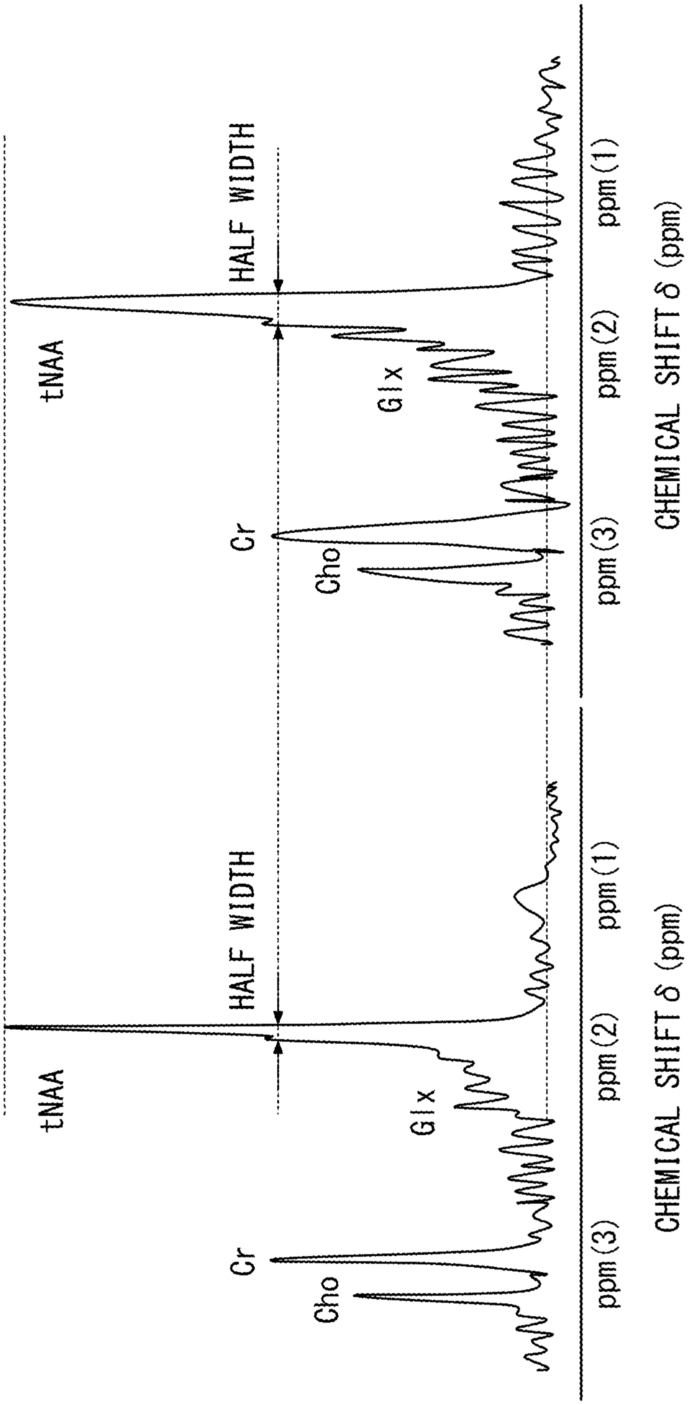
FIG. 13A and FIG. 13B are schematic waveform diagrams illustrating a second case of the spectral quality evaluation of the MRI apparatus according to the second embodiment.

FIG. 13A and FIG. 13B illustrate the case of using the FWHM (Full Width at Half Maximum) as the metric for determining whether the spectral quality satisfies the predetermined evaluation criterion or not. The FWHM of a spectrum peak is expressed by Expression 1 below, for example. In Expression 1, T2 is a transverse relaxation time, γ is a gyromagnetic ratio, ABO is change amount in the static magnetic field strength, and (Window Function) is a window function.

$$FWHM = \frac{1}{\pi T2} + \gamma \Delta B0 + (\text{Window Function}) \quad \text{Expression 1}$$

Since the spectrum is obtained by performing Fourier transform on the MR signals (for example, the MR spectral data D3), the FWHM of the peak of the spectrum changes depending on the speed of free induction decay. For example, when shimming is insufficient and the static magnetic field is non-uniform, as compared with the case of having the uniform static magnetic field, the free induction decay becomes faster and the FWHM becomes wider as shown in Expression 1. The spectra in FIG. 13A exemplifies a case of detecting the spectra from the same object in the state where the magnetic field uniformity is higher than the case of FIG. 13B. Depending on whether the FWHM satisfies a predetermined reference value or not, whether the spectral quality satisfies the predetermined evaluation criterion or not can be determined.

Figures 14A, 14B, 14C:
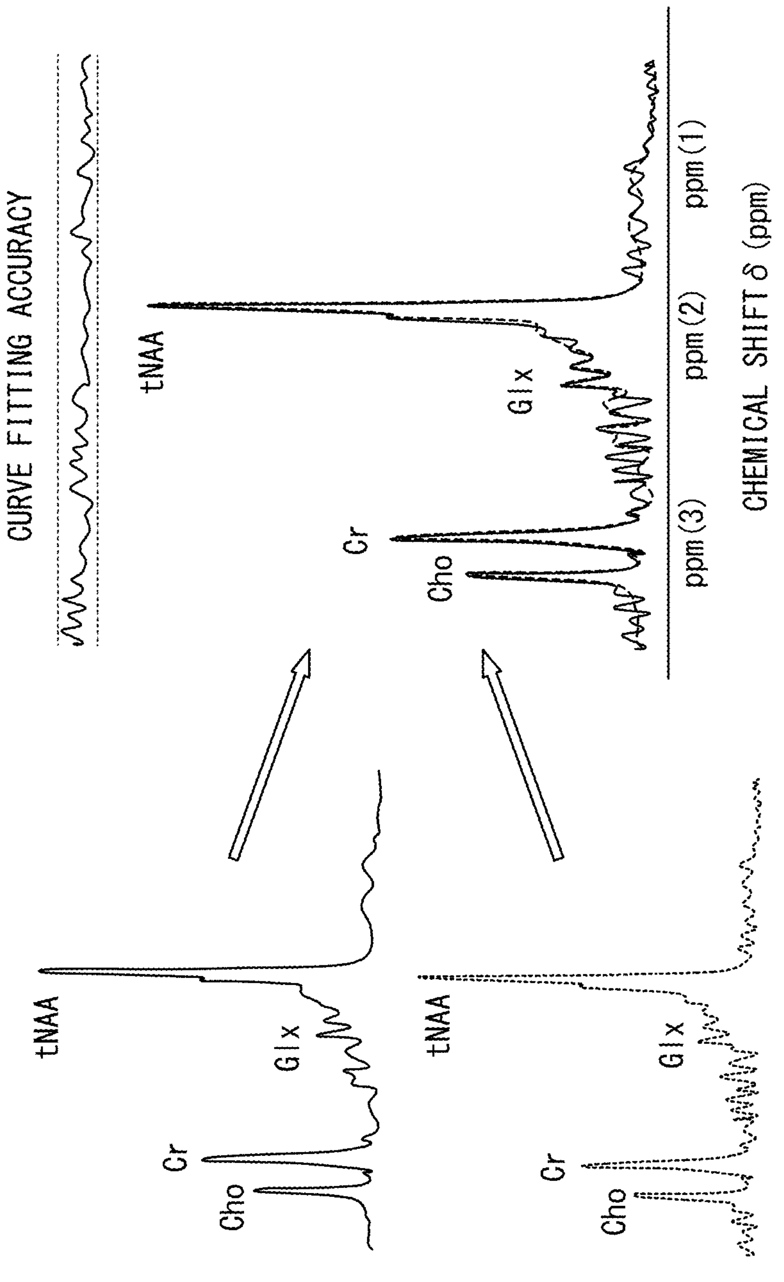
FIG. 14A to FIG. 14C are schematic waveform diagrams illustrating a third case of the spectral quality evaluation of the MRI apparatus according to the second embodiment.

FIG. 14A to FIG. 14C illustrate the case of using the curve fitting accuracy as the metric for determining whether the spectral quality satisfies the predetermined evaluation criterion or not. FIG. 14A illustrates spectra generated on the basis of the actually acquired MR signals. FIG. 14B illustrates spectra obtained by linearly combining the spectra of respective known metabolites for the target metabolite. FIG. 14C illustrates the accuracy when the spectra of FIG. 14A are curve-fitted to the spectra of FIG. 14B. For curve fitting, known techniques for increasing accuracy, such as baseline distortion correction, can be used. Depending on whether the accuracy of curve fitting satisfies a predetermined reference value set in advance or not, whether the spectral quality satisfies the predetermined evaluation criterion or not can be determined.

Returning to FIG. 10, if the shimming necessity determination function F4 determines to reacquire the shimming data D1, i.e., if the spectral quality does not satisfy the predetermined evaluation criterion, the shimming data acquisition function F1 reacquires the shimming data D1 during the MRS scan. In other words, if the determination result is NO in the step ST170, the processing returns to the step ST110. In the next step ST120, the correction control function F2 controls the electric current value of the shim coil 13 during the MRS scan on the basis of the reacquired shimming data D1. Furthermore, the processing follows the steps in the flowchart of FIG. 10.

If the shimming necessity determination function F4 determines reacquisition of the shimming data D1 to be unnecessary, i.e., if the determination result in the step ST170 is YES that the spectral quality satisfies the predetermined evaluation criterion, the processing proceeds to the step ST140. In other words, the MR data acquisition function F3 reacquires part or all of the MR spectral data D3 without reacquiring the shimming data D1.

For example, after completion of the processing shown in the flowchart of FIG. 10, the reacquired data and the acquired data may be integrated. The integration function F8 integrates the reacquired data and the acquired data. The presentation function F7 may present options on whether to integrate the reacquired data and the acquired data or not, such that the user can make a further decision via the input interface 43, for example. The integration of the reacquired data and the acquired data may be automatically performed in accordance with the user's decision. After the reacquisition of the MR spectral data D3, the presentation function F7 may further present options on whether to integrate the reacquired data and the acquired data or not such that the user can make a further decision.

According to the MRI apparatus 1 of the second embodiment, the magnetic field adjustment is performed again when the quality of the spectra generated on the basis of the MR spectral data is not satisfactorily maintained, and thus, the deterioration in quality of the MR data due to decrease in the uniformity of the static magnetic field during the MRS scan can be suppressed. If the quality of the MR data deteriorates because of the reasons other than decrease in the uniformity of the static magnetic field, such as detection of an imperfect spectrum, the missing MR spectral data due to the imperfect spectrum are reacquired without performing the magnetic field adjustment again. In this manner, deterioration in the quality of the MR data can be suppressed without unnecessarily extending the scanning time length.

According to at least one embodiment described above, deterioration in the quality of the MR data due to decrease in uniformity of the static magnetic field during the MR data acquisition can be suppressed.

In the above-described embodiments, the term "processor" means a circuit such as a special-purpose or general-purpose CPU (Central Processing Unit), a GPU (Graphics Processing Unit), an ASIC, a programmable logic device including an SPLD (Simple Programmable Logic Device) and a CPLD (Complex Programmable Logic Device), and an FPGA, for example. The processor implements various functions by reading out and executing the programs stored in the memory.

Although a description has been given of the case where a single processor of the processing circuitry achieves the respective functions in the above-described embodiments, the processing circuitry may be configured by combining a plurality of independent processors in such a manner that each processor implements each function. Further, when a plurality of processors are provided, a memory for storing the programs may be individually provided for each processor or a single memory may collectively store the programs corresponding to the functions of all the processors.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the scope of the inventions as defined by the appended claims.

What is claimed is:

1. An MRI apparatus, comprising:
- a static magnetic field magnet configured to generate a static magnetic field;
- a shim coil configured to enhance uniformity of the static magnetic field; and
- processing circuitry configured to:
  - acquire shimming data using a predetermined shimming pulse sequence for correcting static magnetic field non-uniformity;
  - control an electric current value of the shim coil by using the shimming data;
  - acquire MR image generation data by performing an imaging scan using a predetermined imaging pulse sequence in which magnetic resonance signals for generating an image of an object are acquired;
  - determine whether to reacquire the shimming data during the imaging scan or not, based on the MR image generation data; and
  - reacquire the shimming data during the imaging scan if reacquisition is determined, and control the electric current value of the shim coil during the imaging scan based on reacquired shimming data.

2. The MRI apparatus according to claim 1, wherein the MR image generation data include already acquired MR image generation data and MR image generation data under acquisition through the imaging scan.

3. The MRI apparatus according to claim 1, wherein the processing circuitry is further configured to reacquire part or all of the MR image generation data.

4. The MRI apparatus according to claim 3, wherein the processing circuitry is further configured to select at least one of options (a), (b), and (c),
- the option (a) being an option in which reacquisition of data and integration of reacquired data and acquired data are automatically performed,
- the option (b) being an option in which reacquisition of data is automatically performed and integration of the reacquired data and the acquired data is determined after the reacquisition, and
- the option (c) being an option in which reacquisition of data is not automatically performed.

5. The MRI apparatus according to claim 4, wherein the processing circuitry is further configured to integrate the reacquired data and the acquired data.

6. The MRI apparatus according to claim 1, wherein the processing circuitry is further configured to reacquire the shimming data when a quality of an image to be generated from acquired MR image generation data and MR image generation data under acquisition through the imaging scan does not satisfy a predetermined evaluation criterion.

7. The MRI apparatus according to claim 6, wherein the processing circuitry is further configured to use at least one metric among an SSIM (Structural Similarity Index Measure), a PSNR (Peak Signal to Noise Ratio), an NMSE (Normalized Mean Squared Error), and an MSE (Mean Squared Error) for determining whether the quality of an image satisfies the predetermined evaluation criterion or not.

8. The MRI apparatus according to claim 1, wherein the processing circuitry is further configured to:
- evaluate artifacts of an image to be generated from the MR image generation data during the imaging scan;
- determine whether to reacquire part or all of the MR image generation data during the imaging scan; and
- reacquire part or all of the MR image generation data if it is determined that an evaluation criterion regarding artifacts is not satisfied.

9. The MRI apparatus according to claim 8, wherein the processing circuitry is further configured to:
- calculate a variance of a background in an image of at least one of an imaging region and a k-space region to be generated from the MR image generation data; and
- determine whether to reacquire part or all of the MR image generation data or not.

10. An MRI apparatus, comprising:
- a static magnetic field magnet configured to generate a static magnetic field;
- a shim coil configured to enhance uniformity of the static magnetic field; and
- processing circuitry configured to:
  - acquire shimming data using a predetermined shimming pulse sequence for correcting static magnetic field non-uniformity;
  - control an electric current value of the shim coil by using the shimming data;
  - acquire MR spectral data by an MRS scan using a predetermined MRS pulse sequence in which a spectrum of an object is detected, wherein the spectrum enables observation of at least one metabolite of the object;

determine whether to reacquire the shimming data during the MRS scan or not, based on the MR spectral data; and reacquire the shimming data during the MRS scan if reacquisition is determined, and control the electric current value of the shim coil during the MRS scan based on reacquired shimming data.

11. The MRI apparatus according to claim 10, wherein the MR spectral data include acquired MR spectral data and MR spectral data under acquisition through the MRS scan.

12. The MRI apparatus according to claim 10, wherein the processing circuitry is further configured to further reacquire part or all of the MR spectral data.

13. The MRI apparatus according to claim 12, wherein the processing circuitry is further configured to reacquire part or all of the MR spectral data for at least one of a metabolite spectrum and a water reference spectrum.

14. The MRI apparatus according to claim 12, wherein the processing circuitry is further configured to select one of options (a), (b), and (c), the option (a) being an option in which reacquisition of data and integration of reacquired data and acquired data are automatically performed, the option (b) being an option in which reacquisition of data is automatically performed and integration of the reacquired data and the acquired data is determined after the reacquisition, and the option (c) being an option in which reacquisition of data is not automatically performed.

15. The MRI apparatus according to claim 10, wherein the processing circuitry is further configured to reacquire the MR spectral data when a quality of a spectrum to be generated from acquired MR spectral data and MR spectral data under acquisition through the MRS scan does not satisfy a predetermined evaluation criterion.

16. The MRI apparatus according to claim 15, wherein the processing circuitry is further configured to use at least one metric among a signal-to-noise ratio, a half bandwidth, and a curve fitting accuracy for determining whether the quality of a spectrum satisfies the predetermined evaluation criterion or not.

17. The MRI apparatus according to claim 10, wherein the processing circuitry is further configured to:

evaluate spectral imperfection of a spectrum to be generated from the MR spectral data during the MRS scan;

determine whether to reacquire part or all of the MR spectral data during the MRS scan; and reacquire part or all of the MR spectral data if it is determined that an evaluation criterion regarding the spectral imperfection is not satisfied.

18. The MRI apparatus according to claim 17, wherein the processing circuitry is further configured to:

calculate a variance of a spectrum based on the MR spectral data under acquisition with respect to acquired MR spectral data; and determine whether to reacquire part or all of the MR spectral data or not.

19. The MRI apparatus according to claim 10, wherein the processing circuitry is further configured to reacquire the shimming data for correcting the static magnetic field non-uniformity with respect to either an entirety of an imaging region or at least one local region within the imaging region.

20. An MRI method of executing at least one of an MRS scan using a predetermined MRS pulse sequence for detecting a spectrum of an object, wherein the spectrum enables observation of at least one metabolite of the object and an imaging scan using a predetermined imaging pulse sequence that acquires magnetic resonance signals for generating an image of the object, the MRI method comprising acquiring shimming data using a predetermined shimming pulse sequence for correcting non-uniformity of a static magnetic field; and controlling an electric current value of a shim coil for enhancing uniformity of the static magnetic field based on the shimming data, wherein, in addition to the at least two steps, the imaging scan further comprises steps of: (i) acquiring MR image generation data by acquiring the magnetic resonance signals for generating an image of the object; (ii) determining whether to reacquire the shimming data or not, based on the MR image generation data; and (iii) reacquiring the shimming data if reacquisition is determined, and controlling the electric current value of the shim coil based on reacquired shimming data, wherein, in addition to the at least two steps, the MRS scan further comprises: (i) acquiring MR spectral data by detecting the spectrum of the object; (ii) determining whether to reacquire the shimming data or not, based on the MR spectral data; and (iii) reacquiring the shimming data if reacquisition is determined, and controlling the electric current value of the shim coil based on reacquired shimming data.

* * * * *